United States Patent

Sumida

[11] Patent Number: 5,360,647
[45] Date of Patent: Nov. 1, 1994

[54] COMPOSITE METAL SHEETS

[75] Inventor: Katsuhiko Sumida, Amagasaki, Japan

[73] Assignee: Daicel Chemical Industries, Ltd., Sakai, Japan

[21] Appl. No.: 859,399

[22] PCT Filed: Sep. 28, 1990

[86] PCT No.: PCT/JP90/01246

§ 371 Date: May 28, 1992

§ 102(e) Date: May 28, 1992

[87] PCT Pub. No.: WO92/05953

PCT Pub. Date: Apr. 16, 1992

[51] Int. Cl.$^5$ .................. C09K 19/00; B32B 15/04
[52] U.S. Cl. ..................... 428/1; 428/216; 428/412; 428/419; 428/425.8; 428/457; 428/458; 428/460; 428/461; 428/463; 428/480
[58] Field of Search ............ 428/1, 216, 412, 419, 428/425.8, 457, 458, 460, 461, 463, 480

[56] References Cited

U.S. PATENT DOCUMENTS

| | | | |
|---|---|---|---|
| 4,384,016 | 5/1983 | Ide et al. | 428/1 |
| 4,737,388 | 4/1988 | Ikenaga et al. | 428/216 |
| 4,737,398 | 4/1988 | Ikenaga et al. | 428/216 |
| 4,963,428 | 10/1990 | Harvey et al. | 428/220 |

FOREIGN PATENT DOCUMENTS

| | | |
|---|---|---|
| 184368 | 6/1986 | European Pat. Off. . |
| 232777 | 8/1987 | European Pat. Off. . |
| 63-6822 | 1/1988 | Japan . |
| 2252738 | 10/1990 | Japan . |
| 3241606 | 10/1991 | Japan . |
| 4136038 | 5/1992 | Japan . |

OTHER PUBLICATIONS

Carl Smith "Metallic Glasses for Magnetic Switches"; IEEE Conf. Record of 15th Power Modulator Symposium; Jun. 14–16, 1982; pp. 22–27.

Primary Examiner—Paul J. Thibodeau
Assistant Examiner—Leszek Kiliman
Attorney, Agent, or Firm—Spencer, Frank & Schneider

[57] ABSTRACT

A composite metal sheet comprising a metal sheet and a liquid crystal polymer layer containing a thermotropic liquid crystal polymer, the liquid crystal polymer layer being bonded to at least one surface of the metal sheet. The thermotropic liquid crystal polymer includes a polyester, a polythiol ester, a polyester amide, a polyazomethine and a polyester carbonate. The liquid crystal polymer layer may be preferably formed with a film containing the thermotropic liquid crystal polymer.

18 Claims, 2 Drawing Sheets

Fig. 1

COMPOSITE METAL SHEETS

CROSS-REFERENCE TO RELATED APPLICATION

This application is the national stage of international application No. PCT/JP90/01246 filed Sep. 28, 1990, the specification of which is hereby incorporated by reference.

TECHNICAL FIELD

The present invention relates to a composite metal sheet, in which a liquid crystal polymer adheres to a metal sheet, usable at a high temperature.

BACKGROUND ART

With the recent demands for decrease in the weight, cost or the like of a motor vehicle or the like, there has been proposed a composite metal sheet obtainable by laminating metal sheets on one another with plastics. For example, Japanese Patent Laid-Open No. 84879/1976 and No. 84880/1976 disclose a light-weight laminated steel sheet in which a polypropylene sheet is being interposed between metal sheets. However, the polypropylene is poor in adhesion to metal, heat resistance, mechanical strength and dimensional stability. Particularly, the adhesion of polypropylene to metal is considerably lowered at a high temperature.

Japanese Patent Publication No. 15785/1979 discloses a composite metal sheet structure in which a polyamide sheet is being interposed between metal sheets. The polyamide used in this composite metal sheet is insufficient in mechanical characteristics at a low temperature, water resistance and adhesion to metal sheets. Particularly at a high humidity, polyamide is considerably decreased in the strength of adhesion to metal sheets.

It is an object of the present invention to provide a composite metal sheet in which a metal sheet is being securely bonded to a polymer layer.

It is another object of the present invention to provide a composite metal sheet having a high adhesive strength at a high temperature.

It is a further object of the present invention to provide a composite metal sheet in which a polymer layer excellent in mechanical characteristics, heat resistance, chemical stability, dimensional stability and water resistance is being bonded to a metal sheet.

DISCLOSURE OF THE INVENTION

To achieve the objects above-mentioned, the inventor have studied intensively and found that a liquid crystal polymer excellent in mechanical characteristics, heat resistance, chemical resistance and the like is securely bonded to a metal sheet, thus accomplishing the present invention. More specifically, the present invention provides a composite metal sheet in which a liquid crystal polymer layer containing a thermotropic liquid crystal polymer is being laminated on at least one surface of a metal sheet.

The present invention also provides a composite metal sheet in which at least two metal sheets are bonded to each other with a liquid crystal polymer layer containing a thermotropic liquid crystal polymer.

The thermotropic liquid crystal polymer include, for example, a polyester, a polythiol ester, a polyester amide, a polyazomethine and a polyester carbonate. Fully aromatic polyesters and fully aromatic polyester amides are preferred as the liquid crystal polymer.

In the specification, the term "liquid crystal polymer" refers to a thermotropic liquid crystal polymer and its compositions adapted to be moldable as flowingly softened when heated, and also adapted to form an anisotropic molten phase presenting birefringence when molten.

The term "film" refers to all relatively thin and substantially flat structures which may also be called "sheets" in the technical field to which the present invention pertains.

These objects and advantages of the present invention will be more understood from the following detailed description with reference to the attached drawings.

DETAILED DESCRIPTION OF THE INVENTION

As to the liquid crystal polymer which may be used in the practice of the method of the present invention, there may be referred to, for example, U.S. Pat. Nos. 4,726,998 and 4,717,624. Components of the liquid crystal polymer are as follows:

(1) at least one component of aromatic dicarboxylic acids and alicyclic dicarboxylic acids;
(2) at least one component of aromatic diols, alicyclic diols and aliphatic diols;
(3) at least one component of aromatic hydroxy carboxylic acids;
(4) at least one component of aromatic thiol carboxylic acids;
(5) at least one component of aromatic dithiols and aromatic thiolphenols; and
(6) at least one component of aromatic hydroxy amines and aromatic diamines.

Liquid crystal polymers may be composed of any of the following combinations:

(i) polyesters comprising the components (1) and (2);
(ii) polyesters comprising the component (3);
(iii) polyesters comprising the components (1), (2) and (3);
(iv) polythiol esters comprising the component (4);
(v) polythiol esters comprising the components (1) and (5);
(vi) polythiol esters comprising the components (1), (4) and (5);
(vii) polyester amides comprising the components (1), (3) and (6); and
(viii) polyester amides comprising the components (1), (2), (3) and (6).

The liquid crystal polymers include aromatic polyazomethines and polyester carbonates which are not included in the category of the combinations of the above-listed components. Typical examples of polyazomethines include poly(nitrilo-2-methyl-1,4-phenylenenitrilo-ethylidyne-1,4-phenyleneethylidyne), poly(nitrilo-2-methyl-1,4-phenylenenitrilomethylidyne-1,4-phenylene-methylidyne), poly(nitrilo-2-chloro-1,4-phenylene-nitrilomethylidyne-1,4-phenylenemethylidyne)

and the like. Polyester carbonates substantially contain 4-oxybenzoyl, dioxyphenyl, dioxycarbonyl and terephthaloyl units.

As typical examples of aromatic dicarboxylic acids, there may be mentioned terephthalic acid, 4,4'-diphenyldicarboxylic acid, 4,4'-triphenyldicarboxylic acid, 2,6-naphthalenedicarboxylic acid, diphenyl ether-4,4'-dicarboxylic acid, diphenoxyethane-4,4'-dicarboxylic acid, diphenoxybutane-4,4'-dicarboxylic acid, diphenylethane-4,4'-dicarboxylic acid, isophthalic acid, diphenyl ether-3,3'-dicarboxylic acid, diphenoxyethane-3,3'-dicarboxylic acid, diphenylethane-3,3'-dicarboxylic acid, naphthalene-1,6-dicarboxylic acid, etc.; and an alkyl-, an alkoxy-, or a halogen-substituted derivatives of the above aromatic dicarboxylic acids such as chloroterephthalic acid, dichloroterephthalic acid, bromoterephthalic acid, methylterephthalic acid, dimethylterephthalic acid, ethylterephthalic acid, methoxyterephthalic acid, ethoxyterephthalic acid and the like.

As alicyclic dicarboxylic acids, there may be mentioned, for example, trans-1,4-cyclohexanedicarboylic acid, cis-1,4-cyclo-hexanedicarboxylic acid, 1,3-cyclohexanedicarboxylic acid, etc.; and an alkyl-, an alkoxy-, or a halogen-substituted derivatives of the above alicyclic dicarboxylic acids such as trans-1,4-(1-methyl) cyclohexanedicarboxylic acid, trans-1,4-(1-chloro) cyclohexanedicarboxylic acid and the like.

As typical examples of aromatic diols, there may be mentioned hydroquinone, resorcinol, 4,4'-dihydroxydiphenyl, 4,4'-dihydroxytriphenyl, 2,6-naphalenediol, 4,4'-dihydroxydiphenyl ether, bis (4-hydroxyphenoxy) ethane, 3,3'-dihydroxydiphenyl, 3,3'-dihydroxydiphenyl ether, 1,6-naphthalenediol, 2,2-bis(4-hydroxyphenyl)propane, 1,1-bis(4-hydroxyphenyl)methane and the like; and an alkyl-, an alkoxy-, or a halogen-substituted derivatives of the above aromatic diols such as chlorohydroquinone, methylhydroquinone, 1-butylhydroquinone, phenylhydroquinone, methoxyhydroquinone, phenoxyhydroquinone, 4-chlororesorcinol, 4-methylresorcinol and so on.

Examples of alicyclic diols include trans-1,4-cyclohexanediol, cis-1,4-cyclohexanediol, trans-1,4-cyclohexanedimethanol, trans-1,3-cyclohexanediol, cis-1,2-cyclohexanediol, trans-1,3-cyclohexanedimethanol, etc.; and an alkyl-, an alkoxy-, or a halogen-substituted derivatives of the above alicyclic diols such as trans-1,4-(1-methyl)cyclohexanediol and trans 1,4-(1-chloro)-cyclohexanediol, etc.

Typical examples of aliphatic diols include straight-chain and branched aliphatic diols such as ethylene glycol, 1,3-propanediol, 1,4-butanediol, neopentyl glycol, etc.

As examples of aromatic hydroxycarboxylic acids, there may be mentioned 4-hydroxybenzoic acid, 3-hydroxybenzoic acid, 6-hydroxy-2-naphthoic acid, 6-hydroxy-1-naphthoic acid and the like; and an alkyl-, an alkoxy-, or a halogen-substituted derivatives of the aromatic hydroxycarboxylic acids such as 3-methyl-4-hydroxybenzoic acid, 3,5-dimethyl-4-hydroxybenzoic acid, 2,6-dimethyl-4-hydroxybenzoic acid, 3-methoxy-4-hydroxybenzoic acid, 3,5-dimethoxy-4-hydroxybenzoic acid, 6-hydroxy-5-methyl-2-naphthoic acid, 6-hydroxy-5-methoxy-2-naphthoic acid, 3-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 6-hydroxy-5-chloro-2-naphthoic acid, 6-hydroxy-7-chloro-2-naphthoic acid, 6-hydroxy-5,7-dichloro-2-naphthoic acid and the like.

As examples of aromatic mercapto carboxylic acids, there may be mentioned 4-mercaptobenzoic acid, 3-mercaptobenzoic acid, 6-mercapto-2-naphthoic acid, 7-mercapto-2-naphthoic acid, etc.

Aromatic dithiols include, for example, benzene-1,4-dithiol, benzene-1,3-dithiol, 2,6-naphthalenedithiol, 2,7-naphthalenedithiol, etc.

Aromatic mercapto phenols include, for example, mercaptophenol, 3-mercaptophenol, 2-mercaptophenol, etc.

Examples of aromatic hydroxy amines and aromatic diamines include 4-aminophenol, N-methyl-4-aminophenol, 1,4-phenylenediamine, N-methyl-1,4-phenylenediamine, N,N'-dimethyl-1,4-phenylenediamine, 3-aminophenol, 3-methya-4-aminophenol, 2-chloro-4-aminophenol, 4-amino-1-naphthol, 4-amine-4'-hydroxydiphenyl, 4-amino-4'-hydroxydiphenyl ether, 4-amino-4'-hydroxydiphenylmethane, 4-amino-4'-hydroxydiphenyl sulfide, 4,4'-diaminodiphenyl diphenyl sulfone, 2,5-diaminotoluene, 4,4'-ethylenedianiline, 4,4'-diaminodiphenoxyethane, 4,4'-diaminodiphenylmethane (methylenedianiline), 4,4'-diaminodiphenyl ether (oxydianiline), etc.

The above-listed polymers include those which may present, when molten, no birefringence dependent on the constituent components, the ratio of the components in the polymer and sequence distribution. The polymers to be used in the present invention are limited to those which present birefringence when molten.

As to a method of manufacturing a liquid crystal polymer to be used in the present invention, it is possible to refer to any of conventional methods, for example, those disclosed in the U.S. Pat. Nos. 4,726,998 and 4,717,624 mentioned earlier.

Fully aromatic polymers suitably used in the present invention tend to be substantially insoluble in common solvents, and therefore are unsuitable for solution processing. However, such polymers may be readily processed by a normal melt processing. Particularly preferable fully aromatic polymers are somewhat soluble in pentafluorophenol.

The preferred fully aromatic polyesters used in the present invention have usually a weight average molecular weight of about 2,000 to 200,000, preferably about 10,000 to 50,000, and more preferably about 20,000 to 25,000. The preferred fully aromatic polyester amides have usually a weight average molecular weight of about 5,000 to 50,000, preferably about 10,000 to 30,000, for example, 15,000 to 17,000. These molecular weights can be measured by gel permeation chromatography and other standard methods not causing dissolution of polymers, for example, determination of terminal groups by the infrared spectrophotometry of a compression-formed film. The molecular weights may also be measured by preparing a pentafluorophenol solution and using a light scattering method.

When dissolved in pentafluorophenol at a concentration of 0.1 wt % at 60° C., the fully aromatic polyester amides generally show an intrinsic viscosity (I.V.) of at least about 2.0 dl/g, for example, in a range from about 2.0 to 10.0 dl/g.

The preferred polyesters forming an anisotropic molten phase contain repeating units comprising naphthalene moleties, such as 6-hydroxy-2-naphthalene, 2,6-dihydroxynaphthalene, and 2,6-dicarboxynaphthalene in quantities larger than about 10 mol %. The preferred polyester amides contain repeating units of the above-said naphthalene moieties and the other moieties comprising 4-aminophenol or 1,4-phenylenediamine. More specifically, polyesters and polyester amides are as follows:

(A) Polyesters substantially composed of the following repeating units I and II:

I

II

The polyesters contain about 10 to 90 mol % of the unit I and about 10 to 90 mol % of the unit II. In one aspect, the unit I is present in a quantity ranging from about 65 to 85 mol % (e.g., about 75 mol %). In another aspect, the unit II is present in a quantity of as small as about 15 to 35 mol %, preferably 20 to 30 mol %. At least one hydrogen atom bonded to the ring may be substituted by a substituent selected from the group consisting of an alkoxy group having 1 to 4 carbon atoms, a halogen atom, phenyl group, a substituted phenyl group and a combination of these groups.

(B) Polyesters substantially composed of the following repeating units II, III and IV:

II

III

IV

The polyesters contain about 30 to 70 mol % of the unit II. Polyesters are preferably composed of about to 60 tool % of the unit II, about 20 to 30 tool % of the unit III and about 20 to 30 mol % of the unit IV. At least one hydrogen atom bonded to the ring may be substituted by a substituent selected from the group consisting of an alkoxy group having 1 to 4 carbon atoms, a halogen atom, phenyl group, a substituted phenyl group and a combination of these groups.

(C) Polyesters substantially composed of the following repeating units II, IV, V and VI:

II

IV

V

VI

(wherein R represents methyl group, chloro, bromo, or the combination thereof, which is a substituent for the hydrogen atom of the aromatic ring).

The polyesters are composed of about 20 to 60 mol of the unit II, about 5 to 35 mol % of the unit IV, about 5 to 18 mol % of the unit V and about 20 to 40 mol % of the unit VI, preferably, about 35 to 45 mol % of the unit II, about 15 to 25 mol % of the unit IV, about 10 to 15 mol % of the unit V and about 25 to 35 mol % of the unit VI. The total molar concentration of the units IV and V is substantially equal to that of the unit VI. At least one hydrogen atom bonded to the ring may be substituted by a substituent selected from the group consisting of an alkyl group having 1 to 4 carbon atoms, an alkoxy group having 1 to 4 carbon atoms, a halogen atom, phenyl group, a substituted phenyl group and a combination of these groups. The fully aromatic polyesters generally show an intrinsic viscosity of at least 2.0 dl/g, for example 2.0 to 10.0 dl/g, when dissolved in pentafluorophenol at a concentration of 0.3 w/v % at a temperature of 60° C.

(D) Polyesters substantially composed of the following repeating units I, II, VII and VIII:

I

II

A Dioxyaryl unit VII represented by the following general formula:

VII (wherein Ar represents a bivalent group containing at least one aromatic ring).

A dicarboxyaryl unit VIII represented by the following general formula:

VIII (wherein Ar has the same meaning as defined above).

The polyesters are composed of about 20 to 40 mol of the unit I, from more than 10 up to about 50 mol % of the unit II, from more than 5 up to about 30 mol % of the unit VII and from more than 5 up to about 30 mol of the unit VIII, preferably about 20 to 30 mol % (for example, about 25 mol %) of the unit I, about 25 to 40 mol % (for example, about 35 mol %) of the unit II, about 15 to 25 mol % (for example, about 20 mol %) of the unit VII and about 15 to 25 mol % (for example, about 20 mole %) of the unit VIII. At least one hydrogen atom bonded to the ring may be substituted by a substituent selected from the group consisting of an alkyl group having 1 to 4 carbon atoms, an alkoxy group having 1 to 4 carbon atoms, a halogen atom, phenyl group, a substituted phenyl group and a combination of these groups.

The units VII and VIII are preferably symmetrical in the sense that bivalent bonds which bond these units to other unitson both sides in main chains of polymers are positionally symmetrical on one or two aromatic rings (for example, these units are in positions of para with each other or on the diagonal ring when present on the naphthalene ring). However, nonsymmetrical units such as those derived from resorcinol or isophthalic acid are also usable.

The preferable dioxyaryl unit VII is;

and the preferable dicarboxyaryl unit VIII is:

(E) Polyesters substantially composed of the following repeating units I, VII and VIII:

I

A dioxyaryl unit VII represented by the following general formula:

VII (wherein Ar has the same meaning as defined above).

A dicarboxyaryl unit VIII represented by the following general formula:

VIII

(wherein Ar has the same meaning as defined above).

The polyesters are composed of about 10 to 90 mol % of the unit I, 5 to 45 mol % of the unit VII and 5 to 45 mol % of the unit VIII, preferably about 20 to 80 mol % of the unit I, about 10 to 40 mol % of the unit VII and about 10 to 40 mol % of the unit VIII. More desirably, the polyesters are composed of about 60 to 80 mol % of the unit I, about 10 to 20 mol % of the unit VII and about 10 to 20 mol % of the unit VIII. At least one hydrogen atom may be substituted by a substituent selected from the group consisting of an alkyl group having 1 to 4 carbon atoms, an alkoxy group having 1 to 4 carbon atoms, a halogen atom, phenyl group, a substituted phenyl group and a combination of these groups.

The preferred dioxyaryl unit VII is;

and the preferred dicarboxyaryl unit VIII is:

(F) Polyester amides substantially composed of the following repeating units I, IX, X and VII:

I

A unit IX represented by the following general formula:

IX (wherein A represents a bivalent group containing at least one aromatic ring or a bivalent trans-cyclohexane group).

A unit X represented by the following general formula:

X (wherein Ar has the same meaning as defined above; Y represents O, NH, or NR; Z represents NH or NR, and R represents an alkyl group having 1 to 6 carbon atoms or an aryl group).

A unit VII represented by the following general formula:

VII

(wherein Ar has the same meaning as defined above).

The polyester amides are composed of about 10 to 90 mol % of the unit I, about 5 to 45 mol % of the unit IX, about 5 to 45 mol % of the unit X and about 0 to 40 mol % of the unit VII. At least one hydrogen atom bonded to the ring may be substituted by a substituent selected from the group consisting of an alkyl group having 1 to 4 carbon atoms, an alkoxy group having 1 to 4 carbon atoms, a halogen atom, phenyl group, a substituted phenyl group and a combination of these groups.

The preferred dicarboxyaryl unit IX is;

the preferred unit X is;

or and the preferred dioxyaryl unit VII is:

Polymers which form an anisotropic molten phase according to the present invention include one wherein one part of a polymer chain is composed of a segment of a polymer forming an anisotropic molten phase as described above and the other part of the polymer chain is composed of a segment of a thermoplastic resin not forming an anisotropic molten phase.

The thermal deformation temperature of the liquid cryatal polymer is usually in a range from about 80° to 400° C., and preferably from about 120° to 350° C. Thus, the polymer is excellent in heat resistance. Particularly, the liquid crystal polymer having a thermal deformation temperature of 150° to 250° C. is excellent in film forming properties.

The elastic modulus of the liquid crystal polymer is in the range of $6.0 \times 10^4$ to $2.5 \times 10^5$ kgf/cm$^2$, preferably $7.5 \times 10^4$ to $2.5 \times 10^5$ kgf/cm$^2$, and more preferably $9.0 \times 10^4$ to $2.5 \times 10^5$ kgf/cm$^2$. The tensile strength of the liquid crystal polymer is in the range of 1,000 to 3,000 kgf/cm$^2$, preferably 1,500 to 3,000 kgf/cm$^2$ and more preferably 1,800 to 3,000 kgf/cm$^2$. Thus, the liquid crystal polymer is excellent in mechanical characteristics. Furthermore, even though the polymer is left in an atmosphere of a temperature of 70° C. and a relative humidity of 96% for 500 hours, the polymer undergoes a change as small as about 0.003 to about 0.02%. This proves that the polymer is excellent in dimensional stability.

The liquid crystal polymer layer may contain at least one member selected from the group consisting of other polymers forming an anisotropic molten phase, thermoplastic resins not forming an anisotropic molten phase, thermosetting resins, low-molecular organic compounds, and inorganic substances. In the composition, the polymer forming an anisotropic molten phase may be thermodynamically compatible with the other component of the composition.

As the thermoplastic resins, there may be mentioned, for example, polyethylene, polypropylene, polybutylene, polybutadiene, polyisoprene, polyvinyl acetate, an ethylene-vinyl acetate copolymer, an ethylene-acrylate copolymer, an ethylene-methacrylate copolymer, an ionomer, polyvinyl chloride, polyvinylidene chloride, a polystyrene, an acrylic resin, an ABS resin, an AS resin, an BS resin, a polyurethane, a silicone resin, an fluoro resin, a polyacetal, a polycarbonate, polyethylene terephthalate, polybutylene terephthalate, an aromatic polyester, a polyamide, polyacrylonitrile, polyvinyl alcohol, a polyvinyl ether, a polyether imide, a polyamide imide, a polyether ether imide, a polyether ether ketone, a polyether sulfone, a polysulfone, a polyphenylene sulfide, and a polyphenylene oxide.

As the thermosetting resins, there may be mentioned, for example, a phenolic resin, an epoxy resin, a melamine resin, a urea resin, an unsaturated polyester and an alkyd resin.

As examples of the low-molecular organic compounds, there may be mentioned additives for common thermoplastic and thermosetting resins, such as plasticizers, light-resistant and weather-proof stabilizers, e.g. antioxidants and ultraviolet absorbers, antistatic agents, flame retarders, coloring agents, e.g. dyestuff and pigment, foaming agents, crosslinking agents, e.g. divinyl compounds, peroxides and vulcanizers, and low-molecular organic compounds used as lubricants for improving fluidity and mold releasability.

The inorganic substances include, for example, additives for common thermoplastic and thermosetting resins, that is, ordinary inorganic fibers such as glass, carbon, metallic, ceramic, boron fibers and asbestos; powdery substances such as calcium carbonate, highly dispersible silicic acid, alumina, aluminium hydroxide, talc powder, mica, glass flake, glass bead, quartz powder, silica sand, various metal powders, carbon black, barium sulfate, and calcium sulfate; inorganic compounds such as silicone carbide, boron nitrate, and silicon nitride; and whiskers and metallic whiskers.

The liquid crystal polymer layer contains at least 50% by weight, preferably 75% by weight or more, of the liquid crystal polymer.

The liquid crystal polymer layer may be formed by applying a polymer composition containing a thermotropic liquid crystal polymer to a metal sheet, but preferably may be formed by laminating a film containing a thermotropic liquid crystal polymer on a metal sheet. The film to be bonded to the metal sheet may be obtained by any of a variety of conventional methods. As a molding method, there may be used, for example, an extrusion molding method such as an inflation method, a T-die method or the like. The film may be uniaxially or biaxially stretched at a suitable magnification with stretching means of roll stretching, calender stretching, belt stretching, tenter stretching, tube stretching or the like.

It has been known that the liquid crystal polymer films has generally large mechanical anisotropic properties. Namely, since the liquid crystal polymer has highly orientating properties, the tensile elastic modulus and mechanical strength of the polymer film are large in the longitudinal direction, i.e., the drawing direction (hereinafter referred to as MD direction). However, the tensile elastic modulus and the mechanical strength of the polymer film are extremely weak in the widthwise direction (hereinafter referred to as TD direction) at right angle to the MD direction. The use of such a film containing the liquid crystal polymer lower the handling, working effectiveness for laminating with the metal sheet. Therefore, a film having small mechanical anisotropic properties is preferably employed for producing the composite metal sheet.

The film having small mechanical anisotropic properties may be prepared, for example, by the following inflation molding method which biaxially orientates the liquid crystal polymer molecules at the same time in the molding process.

According to an inflation molding method with use of a molding machine provided with an inflation die, a molten liquid crystal polymer is extruded downwardly from an annular slit of the inflation die, and the extruded cylindrical film, so called bubble, is expanded and drawn. More specifically, the liquid crystal polymer not only is low in melt viscosity but also weak in the strength (stiffness) of the melted film. Therefore, when the melted liquid crystal polymer is extruded upwardly from the die, dead load acts on the melted film, and it is difficult to expand the cylindrical film stably. Thus, the mechanical anisotropic properties of the liquid crystal polymer film are not improved excessively. While, when the melted liquid crystal polymer is extruded downwardly from the die, the cylindrical film may be expanded with falling by the dead load and drawn smoothly. Thus, the cylindrical film may be stably and continuously expanded to give a film having small mechanical anisotropic properties.

The temperature for melting and extruding the liquid crystal polymer may be selected depending on a type of constituent units of the polymer, the ratio of the components and the like. Suitable melting and extruding temperature for the preferred liquid crystal polymer is selected, for example, in the range of about 180° to 360° C. Clearance of the annular slit, i.e. a lip clearance, is usually about 0.2 to 10 mm, preferably about 0.5 to 4 mm. The diameter of the annular slit is usually less than 200 mm, preferably less than 120 mm.

The cylindrical film extruded from the die is expanded to stretch in the TD direction, and is drafted with drawing to stretch in the MD direction.

Preferred temperature for expanding the cylindrical film is usually within the range of from a temperature which is not lower than the second order transition point of the liquid crystal polymer to a temperature lower by about 10° to 100° C., particularly about 20° to 70° C. than the extrusion temperature.

The expansion of the cylindrical film is carried out according to a conventional manner in which external force acts on the film from the inside to outside. For example, in such method, gas such as air, nitrogen, carbon dioxide and the like is charged from the inside of the inflation die. According to the gas charging method, the cylindrical film is expanded and stretched at a lower portion from the die where the temperature of the film is kinetically balanced with the pressure of the charged gas.

The stretching magnification in the TD direction, i.e. a blow ratio is in the range of about 1.5 to 10 times, preferably about 2 to 8 times, and more preferably about 2.5 to 6 times. If the stretching magnification in the TD direction is not more than 1.5 times, the mechanical anisotropic properties of the film increases. While the stretching magnification in the TD direction exceeds 10 time, in some case, the cylindrical film is led to blowout. The stretching magnification in the MD direction, i.e. a draft ratio is in the range of about 1.5 to 40 times, preferably about 2.5 to 30 times, and more preferably about 5 to 25 times. If the stretching magnification in the MD direction is not more than 1.5 times, it is difficult to expand stably the cylindrical film. While the stretching magnification in the MD direction exceeds 40 times, the polymer molecules orientate intensively in the MD direction to give a film having large mechanical anisotropic properties.

Further, a ratio of the stretching magnification in the TD direction and the stretching magnification in the MD direction influences significantly on the anisotropic properties of the film. When the stretching magnification in the TD direction is represented by Dtd, and the stretching magnification in the MD direction is represented by Dmd, the ratio of the stretching magnification in the TD direction and the stretching magnification in the MD direction is as follows:

$0.1 < Dtd/Dmd < 2.5$, preferably
$0.25 < Dtd/Dmd < 2$, and more preferably
$0.4 < Dtd/Dmd < 1.5$.

When the stretching is conducted in such conditions, the mechanical anisotropic properties of the resultant film is improved considerably to give a film having isotropic or near isotropic film.

The stretching magnification in the TD direction and the stretching magnification in the MD direction are represent by the following formula.

$Dtd = d/D$
$Dmd = v/V = s/S$ wherein d means an diameter of an annular slit of an inflation die, D means a diameter of a cylindrical film expanded in the form of bubble, V represents a linear velocity of a molten polymer delivered from the annular slit, v represents a drawing speed of the cylindrical film, s is an area of the annular slit, and S is a cross-section area of the film.

After stretching, the film is drawn by nip rolls under natural cooling or hot insulating conditions by use of a heat insulating mold. The temperature of the film passing between the nip rolls is in the range of about 50° to 170° C., preferably about 70° to 150° C.

The resultant film is optionally subjected to a heat treatment. The heat treatment may be carried out under a taut or non-taut condition. The heat treatment is conducted in a suitable atmosphere, e.g. air, nitrogen gas, or under vacuum, at a temperature of about 70° to 300° C. The hysteresis cycles of the heat treatment, heat treatment time, tension for the film and the like are determined depending on the type of the film, and the characteristics required for the film.

The film thus obtained shows the following characteristics, where the tensile elastic modulus is represented by TM ($kgf/cm^2$) and the tensile strength represented by TS (kgf/cm$^2$), the liquid crystal polymer layer:

(a) TM (kgf/cm$^2$) in the MD direction:

$6 \times 10^4$ kgf/cm$^2$ or more, preferably $8 \times 10^4$ to $4 \times 10^5$ kgf/cm$^2$, and more preferably $1 \times 10^5$ to $4 \times 10^5$ kgf/cm$^2$.

(b) TM (kgf/cm$^2$) in the TD direction:

0.5 to 1.5 times of TM in the MD direction, preferably 0.75 to 1.25 times of TM in the MD direction, and more preferably 0.8 to 1.1 times of TM in the MD direction.

(c) TS (kgf/cm$^2$) in the MD direction:

$3 \times 10^3$ kgf/cm$^2$ or more, preferably $3 \times 10^3$ to $7.5 \times 10^3$ kgf/cm$^2$, and more preferably $3.2 \times 10^3$ to $6 \times 10^3$ kgf/cm$^2$.

(d) TS (kgf/cm$^2$) in the TD direction:

0.5 times or more of TS in the MD direction, preferably 0.75 to 1.25 times of TS in the MD direction, and more preferably 0.8 to 1.1 times of TS in the MD direction.

The films also have extremely small thermal expansion coefficient as follows and is exceellent in dimensional stability.

Thermal expansion coefficient in the MD direction is: $-1 \times 10^{-5}$ to $+1 \times 10^{-5}/°$ C., preferably $-5 \times 10^{-6}$ to $-1 \times 10^{-6}/°$ C.

Thermal expansion coefficient in the TD direction is: $-1 \times 10^{-5}$ to $+2 \times 10^{-5}/°$ C., preferably $1 \times 10^{-5}$ to $+1.5 \times 10^{-5}/°$ C.

The film for bonding the metal sheet may be subjected to a surface treatment of corona discharge treatment, sputtering treatment, high frequency treatment, flame treatment, chromic acid treatment, solvent etching treatment, or undercoat treatment, or a combination of the treatments above-mentioned.

The film for bonding a metal sheet may be not only a single-layer film, but also a laminate film including a plurality of liquid crystal polymer layers of the same type or different types. Since the liquid crystal polymer layer is excellent in adhesion to metal, no particular restrictions are imposed on the film thickness. However, the thickness of the liquid crystal polymer layer is usually in a range from 1 to 1000 μm and preferably from about 10 to about 750 μm.

The present invention may be applied to a variety of metal sheets in a wide range. As examples of such a metal sheet include a metal sheet made of single metal such as iron, titanium, aluminium, gold, silver, copper or the like; and an alloy sheet, such as a stainless steel sheet, made of (i) metal selected from the group consisting of the metals above-mentioned and (ii) at least one component such as chromium, manganese, nickel, molybdenum, magnesium, zinc, tin, silicon or the like. Preferred metal sheet includes a steel sheet, a stainless steel sheet, an aluminium sheet or the like. There may be applied, to the metal sheet, a variety of surface treatments such as surface polishing, electrolysis treatment, anode oxidation treatment, plating treatment, chemical conversion treatment or the like. No particular restrictions are imposed on the thickness of the metal sheet, as far as the resultant composite metal sheet may be subjected to secondary machining such as bent, drawing or the like. However, the metal sheet has usually a thickness of about 0.01 to about 5 mm. Generally, oil or grease are sticking to a commercially available metal sheet. It is therefore preferable to use such a sheet after degreased. Such degreasing may be carried out by a conventional method, e.g., an organic solvent degreasing method, an alkali degreasing method or the like.

The composite metal sheet of the present invention may be a laminate-type composite metal sheet obtainable by bonding a plurality of metal sheets of the same type or different types with liquid crystal polymer layers, or a composite metal sheet in which a liquid crystal polymer layer is laminated on at least one surface of one metal sheet or the composite metal sheet structure.

Figure 1:
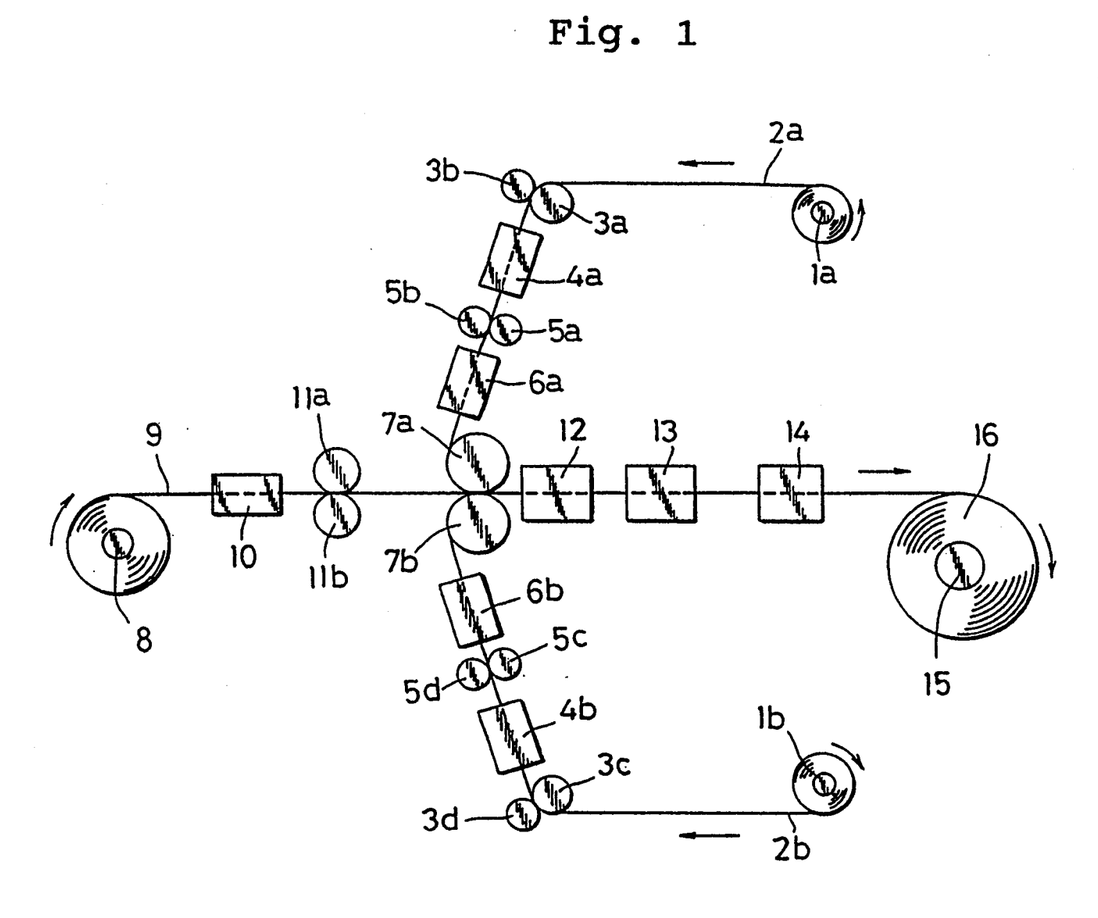
FIG. 1 is a schematic view illustrating an example of steps of continuously manufacturing a composite metal sheet of the present invention.

The composite metal sheet is preferably produced by bonding, to the metal sheet, at least liquid crystal polymer on the film surface molten. More specifically, the composite metal sheet may be prepared by laminating the film previously obtained to the metal sheet, or by laminating directly a molten film extruded with using a extrusion molding machine to the metal sheet. The metal sheet(s) is preferably bonded by heat-compression with the use of a compression molding press or a roll. At this time, the metal sheet(s) and the film(s) may be bonded as cut to such shapes and dimensions as to be suitable for secondary machining. As shown in FIG. 1, a plurality of metal sheets may be continuously bonded with a film thereby to manufacture a composite metal sheet.

In the embodiment shown in FIG. 1, two metal sheets are continuously bonded with a film interposed therebetween. More specifically, metal sheets 2a, 2b respectively wound on rolls 1a, 1b are respectively fed by delivering devices. The metal sheets 2a, 2b are fed between heat-compressing rollers 7a, 7b through first pairs of rollers 3a, 3b and 3c, 3d, levelers 4a, 4b, second pairs of rollers 5a, 5b and 5c, 5d and preheating devices 6a, 6b.

For bonding metal sheets, a film 9 wound on a roll is fed between two metal sheets 2a, 2b through a leveler 10 and a pair of rollers 11a, 11b. The metal sheets 2a, 2b and the film 9 are heat-compressed by the heat-compressing rollers 7a, 7b so that the film 9 sticks to the metal sheets 2a, 2b. The assembly of the metal sheets 2a, 2b and the film 9 is heated by a reheating device 12. The assembly thus re-heated by the re-heated device 12 is cooled by a first cooling device 13 and a second cooling device 14. The assembly thus cooled is then wound on a roll 15 to produce a composite metal sheet 16.

The method of manufacturing the composite metal sheet above-mentioned may comprise at least a step of feeding metal sheets, a step of feeding a film, and a step of melting the film which is then compressed to the metal sheets. Alternately, a liquid crystal polymer may be molten and extruded by an extrusion molding method or the like, and a film in a melting state may be thermally bonded directly to the metal sheets.

Figure 2:
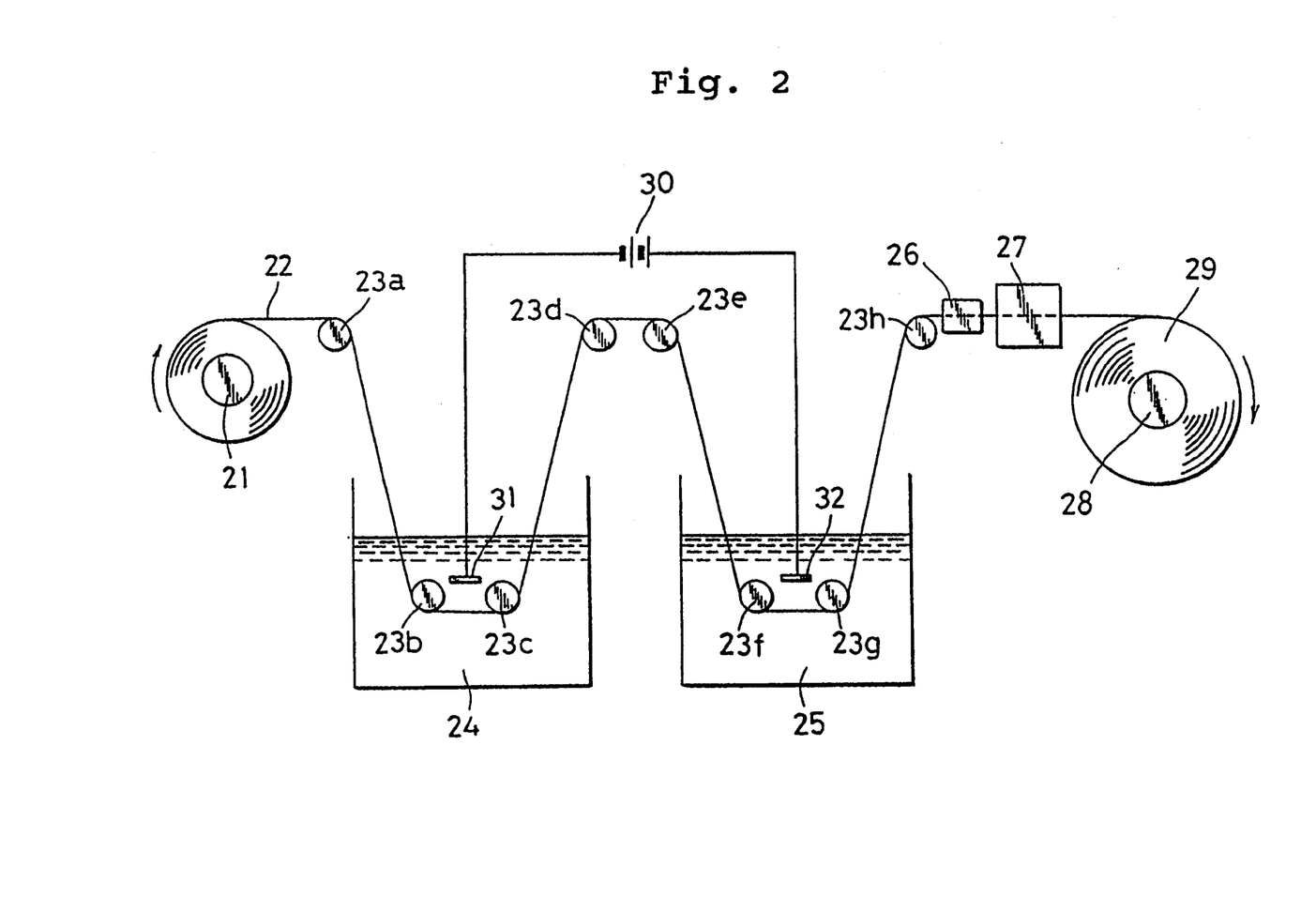
FIG. 2 is a schematic view of steps of continuously degreasing a metal sheet.

To considerably enhance the adhesion to the film, the metal sheets may be previously subjected to degreasing and/or surface treatment as shown, for example, in FIG. 2. In FIG. 2, a metal sheet 22 which is wound on a roller 21 and which has not been degreased yet, is fed to a first electrolyte tank 24 and a second electrolyte tank 25 in which the metal sheet 22 is subjected to electrolysis. The metal sheet 22 is then fed to a water-washing device 26 and a drying device 27. A resultant degreased metal sheet 29 is wound on a roller 28. In FIG. 2, there are also disposed rolls 3a, 23b, 23c, 23d, 23e, 23f, 23g, 23h. An anode electrode plate 31 and a cathode electrode plate 32 connected to a power supply 30 are respectively disposed in the first electrolyte tank 24 and the second electrolyte tank 25.

The degreased metal sheet 29 may be fed directly to the composite metal sheet structure manufacturing steps above-mentioned, without once wound on the roller 28.

INDUSTRIAL APPLICABILITY

The composite metal sheet of the present invention may be used, in a variety of fields such as a member requiring high heat-resistance, e.g., a flexible printed circuit board, a capacitor, a frying-pan coated with a film or the like; a member of a motor vehicle, e.g., a member used around an engine, a backing member for a bonnet or the like; a housing of an automatic laundry machine, an office automation apparatus, an automatic vending machine or the like; a building material; a protecting member for soft metal sheet or the like.

The following Examples and Comparative Examples illustrate the invention in further detail but are by no means limitative of the scope thereof.

EXAMPLES

EXAMPLE 1

Pellets of a liquid crystal polymer (VECTRA A 900 manufactured by Polyplastics Co., Ltd.) comprising polyester (A) composed of the repeating units I and II mentioned earlier, was molded to a film having a thickness of 100 μm with the use of a normal T-die extruder. This film was held by and between two cold-rolled steel sheets each having a thickness of 400 μm. The assembly of the liquid crystal polymer film and metal sheets was heated and compressed at a temperature at which the polymer of the film was molten. This caused two cold-rolled steel sheets to be bonded to each other, thus producing a composite metal sheet.

EXAMPLE 2

Under the following conditions, a liquid crystal polymer used in the Example 1 was extruded and molded into a film having a thickness of 75 μm with the use of a extrusion machine provided with an inflation die.

| Extrusion direction: | downwardness |
|---|---|
| Temperature of extrusion: | 290° C. |
| Lip clearance: | 1.0 mm |
| Blow ratio Dtd: | 4.0 |
| Draft ratio Dmd: | 5.0 |
| Dtd/Dmd: | 0.80 |

The resultant film had the following mechanical characteristics:
Tensile elastic modulus in the MD direction:
$12 \times 10^4$ kgf/cm$^2$
Tensile elastic modulus in the TD direction:
$10 \times 10^4$ kgf/cm$^2$
Tensile strength in the MD direction:
$3.4 \times 10^3$ kgf/cm$^2$
Tensile strength in the TD direction:
$3.1 \times 10^3$ kgf/cm$^2$
The resultant film was held by and between two cold-rolled steel sheets each having a thickness of 400 μm. The assembly of the liquid crystal polymer film and metal sheets was heated and compressed at a temperature at which the polymer of the film was molten. This caused two cold-rolled steel sheets to be bonded to each other, thus producing a composite metal sheet.

Comparative Example 1

A composite metal sheet was prepared in the same manner as in Example 1, except for the use of polybutylene terephthalate (JURANEX 2000 manufactured by Polyplastics Co., Ltd.) instead of the liquid crystal polymer used in Example 1.

Comparative Example 2

A composite metal sheet was prepared in the same manner as in Example 1, except for the use of a polyester imide (ULTEM - 1000 manufactured by Engineering Plastic Co., Ltd.) instead of the liquid crystal polymer used in Example 1.

Comparative Example 3

A composite metal sheet was prepared in the same manner as in Example 1, except that a polycarbonate (UPIRON S 1000 manufactured by Mitsubishi Gas Chemical Co., Ltd.) was used instead of the liquid crystal polymer used in Example 1.

Comparative Example 4

A composite metal sheet was obtained in the same manner as in Example 1, except that a polyarylate (U-POLYMER-U-100 manufactured by Unitika Ltd.) was used instead of the liquid crystal polymer used in Example 1.

Comparative Example 5

A composite metal sheet was prepared in the same manner as in Example 1, except for the use of an adhesive polypropylene (MODIC P-310 manufactured by Mitsubishi Petrochemical Co., Ltd.) instead of the liquid crystal polymer used in Example 1.

Comparative Example 6

A composite metal sheet was obtained in the same manner as in Example 1, except for the use of an adhesive polyethylene (MODIC L-100 manufactured by Mitsubishi Petrochemical Co., Ltd.) instead of the liquid crystal polymer used in Example 1.

The strength of adhesion of the polymer to the metal sheets in each of the composite metal sheet thus obtained was measured with the measuring temperature changed. The results are shown in Table. In Table, the T-peel strength and tensile shear strength were measured at 20° C. and 120° C. according to JIS K 6854 and JIS K 6850, respectively.

TABLE

| Item to be measured | T-peel Strength (kg/25 mm) | | Tensile Shear Strength (kg/cm$^2$) | |
|---|---|---|---|---|
| Measuring Temp. (°C.) | 20 | 120 | 20 | 120 |
| Example 1 | 15 | 10 | 160 | 90 |
| Example 2 | 15 | 10 | 160 | 90 |
| Comparative Example 1 | 0.1 or less | — | 1 or less | — |
| Comparative Example 2 | 0.1 or less | — | 1 or less | — |
| Comparative Example 3 | 0.1 or less | — | 1 or less | — |
| Comparative Example 4 | 0.1 or less | — | 1 or less | — |
| Comparative Example 5 | 13 | 0.3 | 140 | 1 |
| Comparative Example 6 | 15 | Molten | 150 | Molten |

As apparent from Table, the film of Examples show a considerably great adhesion strength not only at a room temperature but also at a high temperature, as compared with the polymers of Comparative Examples.

I claim:

1. A composite metal sheet comprising a metal sheet and a liquid crystal polymer layer laminated on at least one surface of said metal sheet, said polymer layer containing a thermotropic liquid crystal polymer layer formed by a film having the following characteristics:

(a) tensile elastic modulus in the longitudinal direction: $6 \times 10^4$ kgf/cm$^2$ or more,
(b) tensile elastic modulus in the cross direction: 0.5 to 1.5 times of the tensile elastic modulus in the longitudinal direction,
(c) tensile strength in the longitudinal direction: $3 \times 10^3$ kgf/cm$^2$ or more, and
(d) tensile strength in the cross direction: 0.75 to 1.25 times of the tensile length in the longitudinal direction.

2. The composite metal sheet according to claim 1, wherein at least two metal sheets are bonded to each other with a liquid crystal polymer layer containing a thermotropic liquid crystal polymer.

3. The composite metal sheet according to claim 1, wherein the thermotropic liquid crystal polymer is at least one polymer selected from the group consisting of a polyester, a polythiol ester, a polyester amide, a polyazomethine, and a polyester carbonate.

4. The composite metal sheet according to claim 1, wherein the thermotropic liquid crystal polymer is a fully aromatic polyester.

5. The composite metal sheet according to claim 1, wherein the thermotropic liquid crystal polymer is a fully aromatic polyester amide.

6. The composite metal sheet according to claim 1, wherein the thermotroplc liquid crystal polymer is a polymer substantially containing 10 to 90 mol % of the following repeating unit I and 10 to 90 mol % of the following repeating unit II:

I

II

7. The composite metal sheet according to claim 1, wherein the thermal deformation temperature of the thermotropic liquid crystal polymer is in a range from about 120° to 350° C.

8. The composite metal sheet according to claim 1, wherein the tensile elastic modulus in the longitudinal direction of the thermotropic liquid crystal polymer is in a range from about $6 \times 10^4$ to $2.5 \times 10^5$ kgf/cm$^2$.

9. The composite metal sheet according to claim 1, wherein the tensile strength of the thermotropic liquid crystal polymer is in a range from about 1,000 to 3,000 kgf/cm$^2$.

10. The composite metal sheet according to claim 1, wherein the thermotropic liquid crystal polymer presents dimensional variations from about 0.003 to 0.02% at a temperature of 70° C. and at a relative humidity of 96%.

11. The composite metal sheet according to claim 1, wherein the film has the following thermal expansion characteristics:
thermal expansion coefficient in the longitudinal direction: $-1 \times 10^{-5}$ to $+1 \times 10^{-5}/°$ C., and
thermal expansion coefficient in the cross direction: $-1 \times 10^{-5}$ to $+2 \times 10^{-5}/°$C.

12. The composite metal sheet according to claim 1, wherein the liquid crystal polymer layer contains 75% by weight or more of a thermotropic liquid crystal polymer.

13. The composite metal sheet according to claim 1, wherein the metal sheet is a steel sheet, a stainless steel sheet, or an aluminium sheet.

14. The composite metal sheet according to claim 1, wherein the tensile elastic modulus in the longitudinal direction is in a range from about $8 \times 10^4$ to $4 \times 10^5$ kgf/cm$^2$, and said tensile strength in the longitudinal direction is in a range from about $3 \times 10^3$ to $7.5 \times 10^3$ kgf/cm$^2$.

15. The composite metal sheet according to claim 1, wherein the tensile elastic modulus in the longitudinal direction is in a range from about $1 \times 10^5$ to $4 \times 10^5$ kgf/cm$^2$, and said tensile strength in the longitudinal direction is in a range from about $3.2 \times 10^3$ to $6 \times 10^3$ kgf/cm$^2$.

16. The composite metal sheet according to claim 4, wherein the weight-average molecular weight of the fully aromatic polyester is in a range from about 2,000 to 200,000.

17. The composite metal sheet according to claim 5, wherein the weight-average molecular weight of the fully aromatic polyester amide is in a range from about 5,000 to 50,000.

18. The composite metal sheet according to claim 7, wherein the thermal deformation temperature of the thermotropic liquid crystal polymer is in a range from about 150° to 250° C.

* * * * *